United States Patent [19]

Narahara

[11] Patent Number: 5,155,379
[45] Date of Patent: Oct. 13, 1992

[54] CLOCKED DRIVER CIRCUIT STABILIZED AGAINST CHANGES DUE TO FLUCTUATIONS IN R.C. TIME CONSTANT

[75] Inventor: Tetsuya Narahara, Tokyo, Japan

[73] Assignee: NEC Corporation, Tokyo, Japan

[21] Appl. No.: 714,434

[22] Filed: Jun. 13, 1991

[30] Foreign Application Priority Data

Jun. 25, 1990 [JP] Japan .................................. 2-165916

[51] Int. Cl.[5] .......................... H03K 5/13; H03K 3/29; H03K 5/13
[52] U.S. Cl. .................................. 307/269; 307/272.1; 307/291; 307/595; 307/597; 307/603; 307/605
[58] Field of Search ...................... 307/272.1, 290, 590, 307/595, 597, 603, 605, 480, 269, 291

[56] References Cited

U.S. PATENT DOCUMENTS 4,213,064  7/1980  Nagano ............................... 307/269
4,439,690  3/1984  Maley et al. ........................ 307/272.1

OTHER PUBLICATIONS

Reference Data for Radio Engineers, Fifth Edition, Howard W. Sams & Co., Inc., 1968, pp. 20-27.

Communications-Electronics Terminology, Air Force Manual AFM 100-39, Apr. 1959, pp. 39-521.

Primary Examiner—Janice A. Howell
Assistant Examiner—Trong Phan
Attorney, Agent, or Firm—Laff, Whitsel, Conte & Saret

[57] ABSTRACT

A clocked driver circuit includes a first gate circuit, a second gate circuit, a first time constant circuit, a second time constant circuit, a first switching circuit, and a second switching circuit. The first gate circuit has one input terminal connected to a first input terminal. The second gate circuit has one input terminal connected to a second input terminal. The first time constant circuit is connected between the output terminal of the first gate circuit and the other input terminal of the second gate circuit. The second time constant circuit is connected between the output terminal of the second gate circuit and the other input terminal of the first gate circuit. The first switching circuit controls the time constant of the first time constant circuit in accordance with an output from the first gate circuit. The second switching circuit controls the time constant of the second time constant circuit in accordance with an output from the second gate circuit.

7 Claims, 5 Drawing Sheets

CLOCKED DRIVER CIRCUIT STABILIZED AGAINST CHANGES DUE TO FLUCTUATIONS IN R.C. TIME CONSTANT

BACKGROUND OF THE INVENTION

The present invention relates to a semiconductor integrated circuit constituted by MOSFETs and, more particularly, to a clocked driver circuit.

FIG. 4 shows a conventional clocked driver circuit. This circuit comprises a first NAND circuit 1 having first and second input terminals respectively connected to an input terminal ①and a node ⑤ and having an output terminal connected to a node ③, a first inverter 2 having input and output terminals respectively connected to the node ③ and an output terminal ⑦, a second NAND circuit 3 having first and second input terminals respectively connected to a node ⑥ and an input terminal ② and having an output terminal connected to a node ④, a second inverter 4 having input and output terminals respectively connected to the node ④ and an output terminal ⑧, a first resistive element 5 connected between the nodes ③ and ⑥, a second resistive element 6 connected between the nodes ⑤ and ④, a first capacitive element 7 connected between the node ⑤ and the ground potential, and a second capacitive element 8 connected between the node ⑥ and the ground potential.

FIG. 5 shows an operation of the circuit in FIG. 4.

Complementary signals indicated by ① and ② in FIG. 5 are input to the first and second input terminals. Assume that in an initial state, the signal ① is at low level; the signal ②, high level; a signal ③, high level; a signal ④, low level; a signal ⑤, low level; a signal ⑥, high level; a signal ⑦, low level; and a signal ⑧, high level.

When the signal ② as the second input is changed from high level to low level (at the same time, the signal ① as the first input is changed from low level to high level), the signal ④ is changed from low level to high level, and the signal ⑤ is changed from low level to high level by an RC time constant. When the signal ⑤ exceeds the threshold value of the NAND circuit 1, the signal ③ is changed from high level to low level, and the signal ⑥ is changed from high level to low level by the RC time constant. When the signal ① as the first input is changed from high level to low level (at the same time, the signal ② as the second input is changed from low level to high level), the signal ③ is changed from low level to high level, and the signal ⑥ is changed from low level to high level by the RC time constant. When the signal ⑥ exceeds the threshold value of the NAND circuit 3, the signal ④ is changed from high level to low level, and the signal ⑤ is changed from high level to low level by the RC time constant.

The above operation is repeated to obtain the signals ⑦ and ⑧ in FIG. 5 as output signals, which are the inverted signals of the signals ③ and ④. A characteristic feature of the circuit is that when a single-phase signal having a frequency f is input, two-phase signals can be obtained as output signals which have the frequency f and do not overlap each other at high level, by changing the cycle.

In the conventional clocked driver circuit, in order to prolong an interval in which both the first and second output signals are at low level, changes in potential of the signals ⑤ and ⑥ are delayed by increasing the values of the resistive elements 5 and 6 or the capacitive elements 7 and 8 to increase the RC time constant. If, however, this RC time constant is excessively increased, the potentials of the signals ⑤ and ⑥ are not fully amplified between the power source potential and the ground potential, as shown in FIG. 6. As a result, the timings of output signals from the clocked driver circuit are undesirably changed because of fluctuations of characteristics of the resistive elements, the capacitive elements, and the MOSFETs, or noise.

SUMMARY OF THE INVENTION

It is an object of the present invention to provide a clocked driver circuit in which an interval in which both first and second outputs are at low level can be prolonged by increasing an RC time constant.

It is another object of the present invention to provide a clocked driver circuit which can be stably operated by preventing changes in timings of output signals due to fluctuations of characteristics of each element with an increase in RC time constant.

In order to achieve the above objects, according to the present invention, there is provided a clocked driver circuit comprising a first gate circuit having one input terminal connected to a first input terminal, a second gate circuit having one input terminal connected to a second input terminal, a first time constant circuit connected between an output terminal of the first gate circuit and the other input terminal of the second gate circuit, a second time constant circuit connected between an output terminal of the second gate circuit and the other input terminal of the first gate circuit, a first switching circuit for controlling a time constant of the first time constant circuit in accordance with an output from the first gate circuit, and a second switching circuit for controlling a time constant of the second time constant circuit in accordance with an output from the second gate circuit.

DETAILED DESCRIPTION OF THE PREFERRED EMBODIMENTS

The present invention will be described below with reference to the accompanying drawings.

Figure 1:
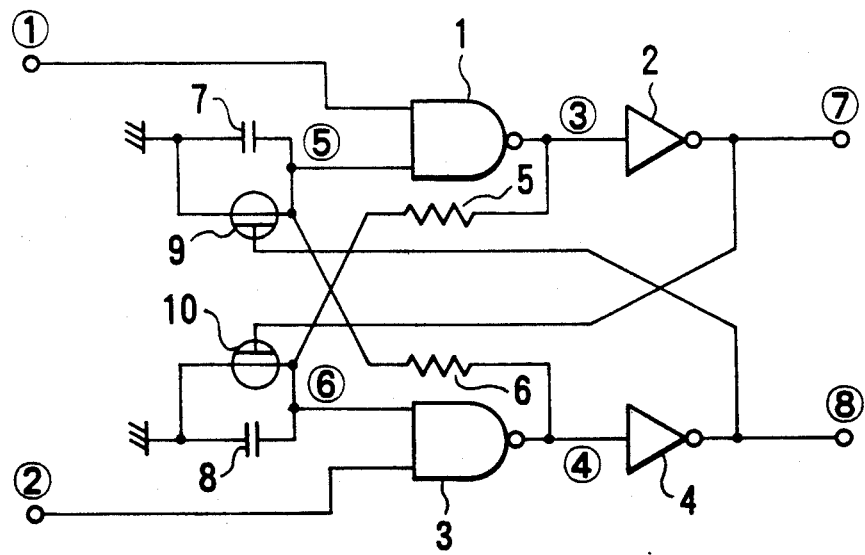
FIG. 1 is a circuit diagram showing the first embodiment of the present invention.

FIG. 1 shows a circuit according to the first embodiment of the present invention. This circuit comprises a first NAND circuit 1 having first and second input terminals respectively connected to an input terminal ① and a node ⑤ and having an output terminal connected to a node ③, a first inverter 2 having input and output terminals respectively connected to the node ③ and an output terminal ⑦, a second NAND circuit 3 having first and second input terminals respectively connected to a node ⑥ and an input terminal ② and having an output terminal connected to a node ④, a second inverter 4 having input and output terminals respectively connected to the node ④ and an output terminal ⑧, a first resistive element 5 connected between the nodes ③ and ⑥, a second resistive element 6 connected between the nodes ⑤ and ④, a first capacitive element 7 connected between the node ⑤ and the ground potential, a second capacitive element 8 connected between the node ⑥ and the ground potential, a first depletion N-channel MOSFET 9 having a source, a gate, and a drain respectively connected to the ground potential, the node ⑧, and the node ⑤, and a second depletion N-channel MOSFET 10 having a source, a gate, and a drain respectively connected to the ground potential, the node ⑦, and the node ⑥.

Figure 2:
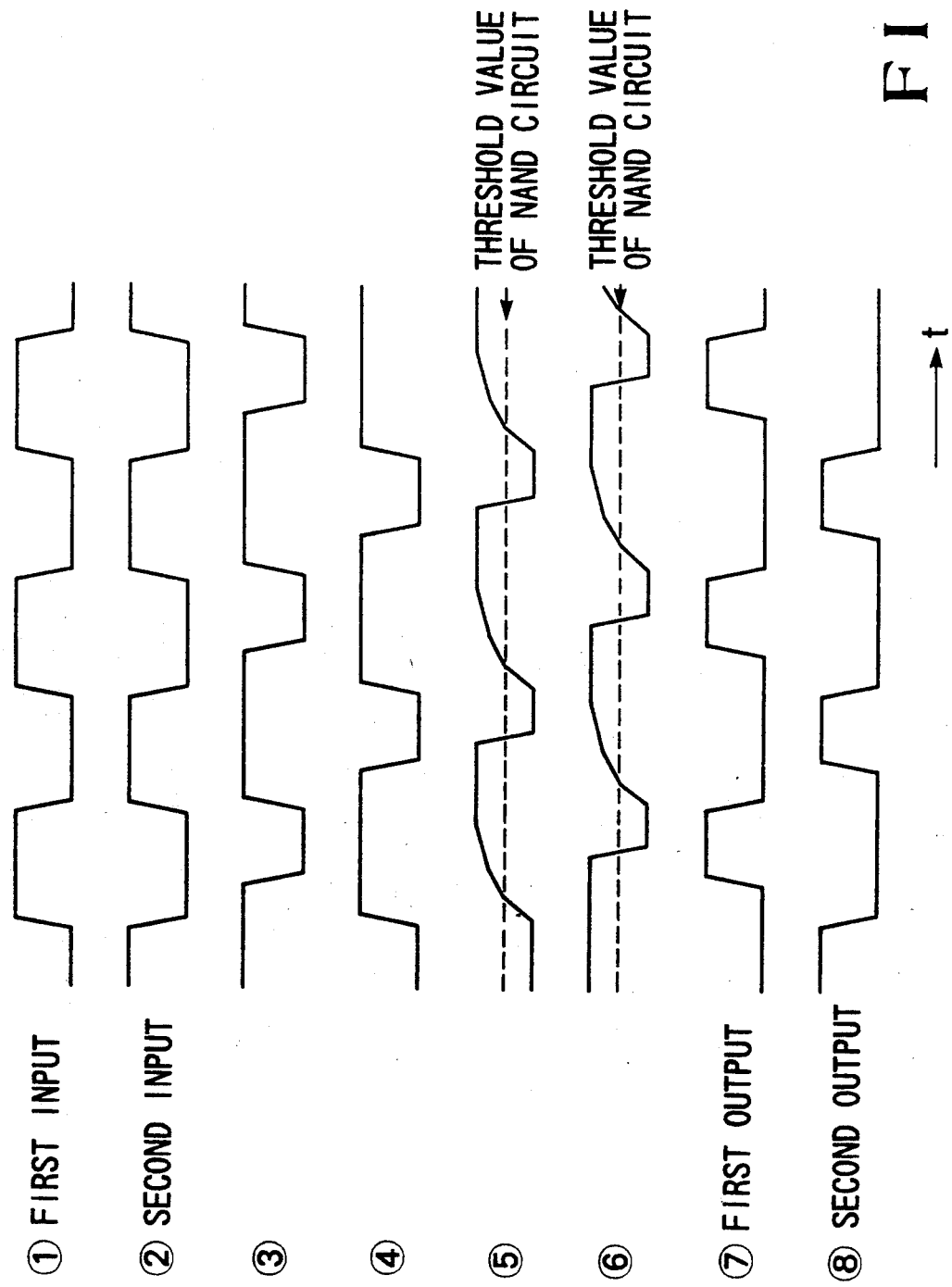
FIG. 2 is a timing chart showing the waveforms of signals at the respective portions in the circuit shown in FIG. 1.

FIG. 2 shows an operation of the circuit. When complementary signals indicated by ① and ② in FIG. 2 are input to the first and second input terminals, the potentials of the respective points are set as indicated by to ③ to ⑥ in FIG. 2, and signals having waveforms indicated by ⑦ and ⑧ in FIG. 2 are output from the first and second output terminals. In the clocked driver circuit of the present invention, when the potential of the signal ⑤ is changed from high level to low level, the N-channel MOSFET 9 is turned on so that the change in potential is caused faster than that caused by the conventional RC time constant. Similarly, when the potential of the signal ⑥ is changed from high level to low level, the N-channel MOSFET 10 is turned on so that the change in potential is caused faster than that caused by the conventional RC time constant. With this operation, the potentials of the signals ⑤ and ⑥ are necessarily changed from the ground potential. Hence, the circuit can be stably operated even if the RC time constant is increased to prolong an interval in which both the first and second outputs are at low level as compared with the conventional circuit.

Figure 3:
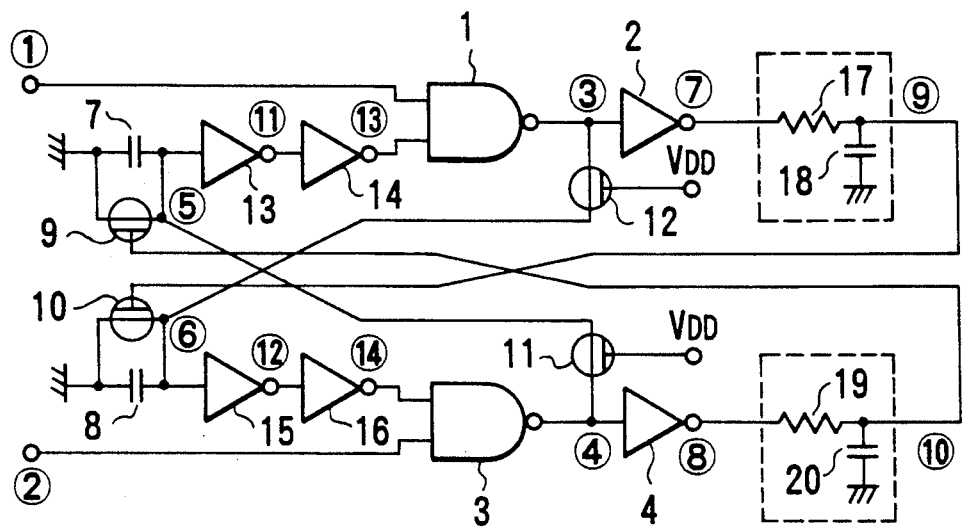
FIG. 3 is a circuit diagram showing the second embodiment of the present invention.
Figure 4:
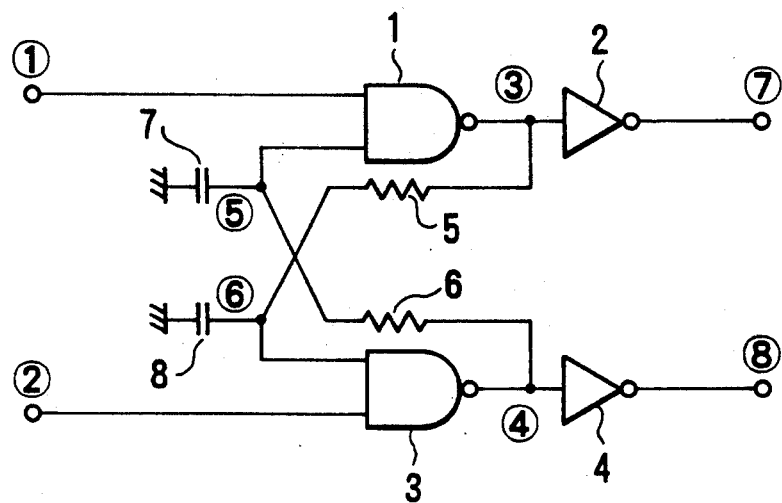
FIG. 4 is a circuit diagram showing a conventional circuit.
Figure 5:
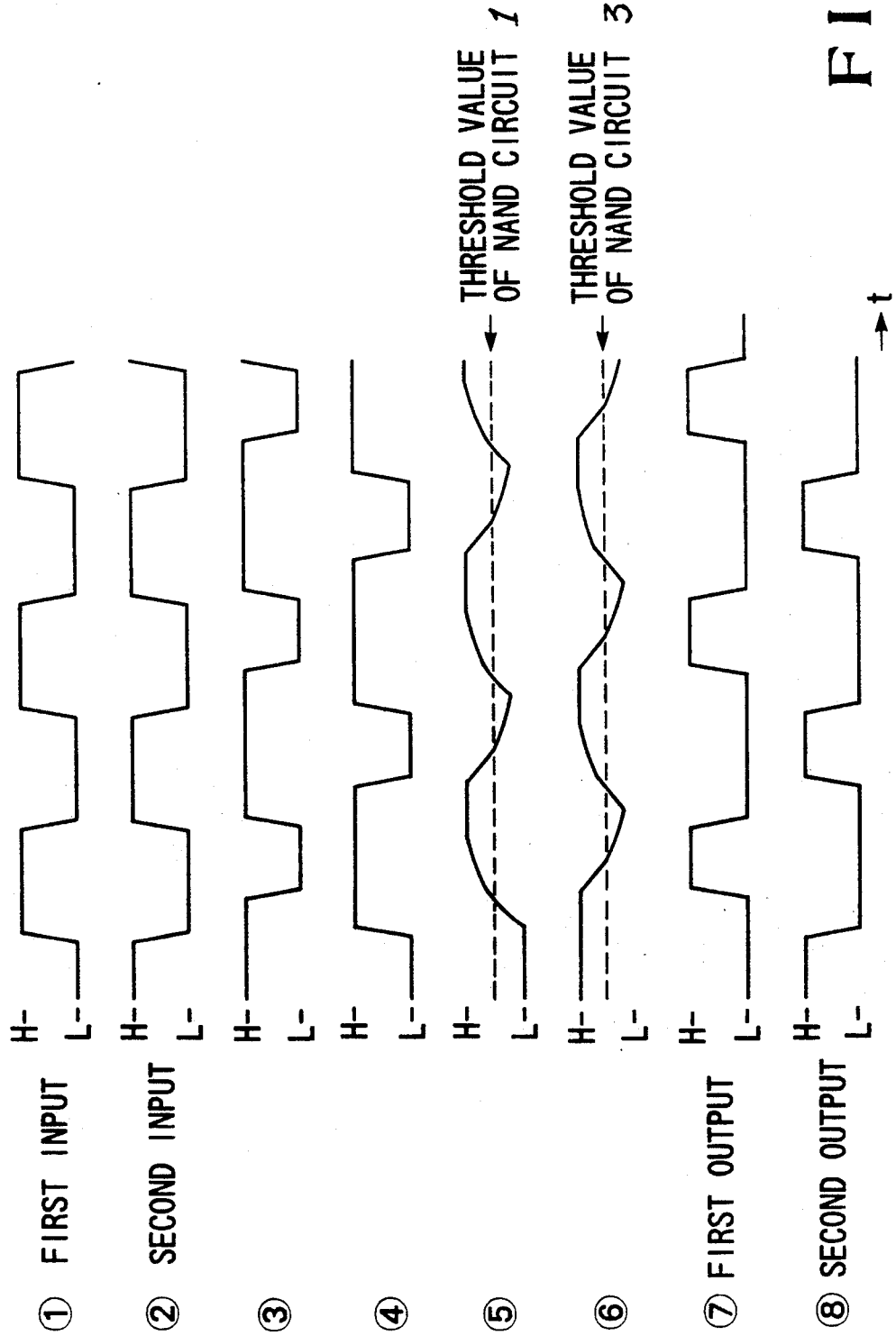
FIG. 5 is a timing chart showing the waveforms of signals at the respective portions in the circuit shown in FIG. 4.
Figure 6:
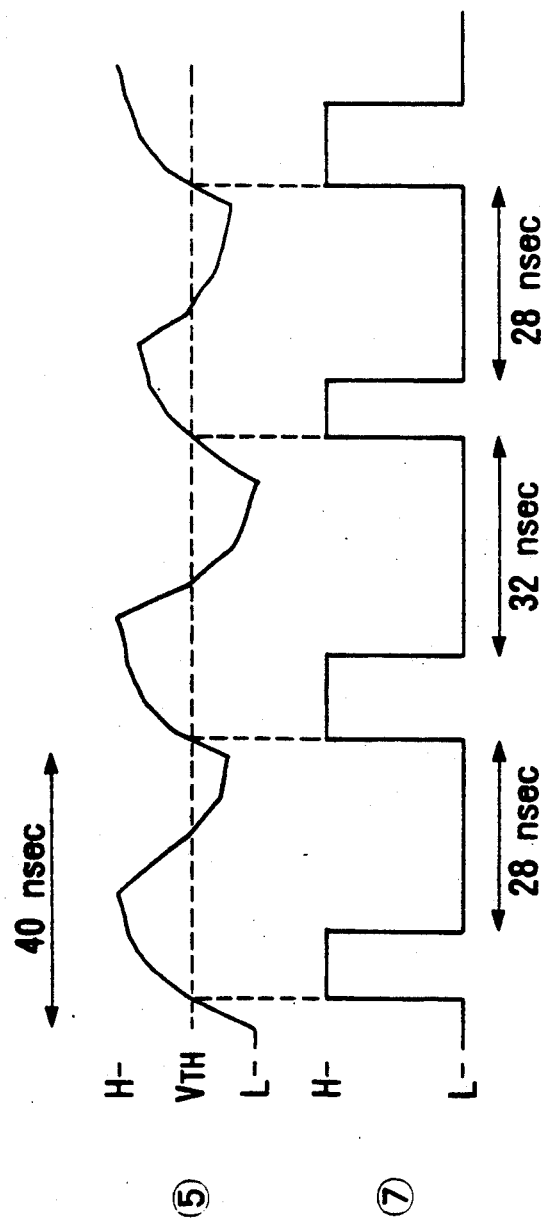
FIG. 6 is a timing chart for explaining problems in an operation of the conventional circuit.

FIG. 3 shows a circuit according to the second embodiment of the present invention. In this circuit, the first and second resistive elements 5 and 6 in the first embodiment are respectively replaced with third and fourth depletion N-channel MOSFETs 11 and 12. The source, gate, and drain of the third depletion N-channel MOSFET 12 are respectively connected to a node ⑥, power source potential $V_{DD}$, and a node ③. The source, gate, and drain of the fourth depletion N-channel MOSFET 11 are respectively connected to a node ⑤, power source potential $V_{DD}$, and a node ④. Third and fourth inverters 13 and 14 are inserted between the second input of a first NAND circuit 1 and the node ⑤. The input and output terminals of the third inverter 13 are respectively connected to the node ⑤ and a node 11. The input and output terminals of the fourth inverter 14 are respectively connected to the node 11 and a second input terminal 13 of the first NAND circuit 1. In addition, fifth and sixth inverters 15 and 16 are inserted between the first input terminal of a second NAND circuit 3 and a node ⑥. The input and output terminals of the fifth inverter 15 are respectively connected to the node ⑥ and a node 12. The input and output terminals of the sixth inverter 16 are respectively connected to the node 12 and a first input terminal 14 of the second NAND circuit 3 Furthermore, the gate of the first N-channel MOSFET is connected to a node 10 at which an output signal is delayed most by a parasitic resistor 19 and a parasitic capacitor 20 on wiring through which output signals from the second inverter 4 are transmitted. The gate of the second N-channel MOSFET is connected to a node ⑨ at which an output signal is delayed most by a parasitic resistor 17 and a parasitic capacitor 18 on wiring through which output signals from the first inverter 2 are transmitted.

In the above embodiment, since the resistive elements are replaced with the Nch depletion transistors, the layout area for resistors can be reduced to ⅓ to ¼ that in the first embodiment, while the same effect as that in the first embodiment can be obtained. In addition, the third to sixth inverters 13 to 16 are inserted, and the logic threshold values of the third and fifth inverters are changed so that the delay time can be changed without influencing other logic threshold values, while the same effect as that in the first embodiment can be obtained. Since the gates of the first and second N-channel MOSFETs 9 and 10 are respectively connected to the nodes 10 and ⑨, the following effect can be obtained in addition to the same effect as that in the first embodiment. Even if the waveforms of the output signals ⑦ and ⑧ from the clocked driver circuit are distorted due to the parasitic resistance and capacitance, since the N-channel MOSFET is not turned off unless one of the signals goes to low level, the other signal is not set at high level. Moreover, the same effect as that of the above-described circuit can be obtained even if the third and fourth depletion N-channel MOSFETs 11 and 12 are respectively replaced with a first depletion P-channel MOSFET whose source, gate, and drain are respectively connected to the node ⑥, the ground potential, and the node ③, and a second depletion P-channel MOSFET whose source, gate, and drain are respectively connected to the node ⑤, the ground potential, and the node ④.

According to the present invention described above, N-channel MOSFETs are connected in parallel with capacitive elements, and each N-channel MOSFET is turned on when the potential of one of the terminals of a corresponding capacitive element which is not connected to the ground potential is changed from high level to low level. With this operation, the clocked driver circuit can be stably operated, and an interval in which the first and second outputs are at low level can be prolonged by increasing the RC time constant.

What is claimed is:

1. A clocked driver circuit comprising:
   a first gate circuit having one input terminal connected to a first input terminal;
   a second gate circuit having one input terminal connected to a second input terminal;
   a first time constant circuit connected between an output terminal of said first gate circuit and another input terminal of said second gate circuit;
   a second tim constant circuit connected between an output terminal of said second gate circuit and another input terminal of said first gate circuit;
   a first switching circuit for controlling a time constant of said first time constant circuit in accordance with an output from said first gate circuit; and
   a second switching circuit for controlling a time constant of said second time constant circuit in accordance with an output from said second gate circuit, said first and second switching circuits being respectively controlled by inverted outputs of the outputs form said first and second gate circuits.

2. A circuit according to claim 1, wherein said first and second switching circuits respectively have control terminals connected to nodes at which output signals are delayed most by parasitic resistances and parasitic capacitances on wiring through which outputs from said first and second gate circuits are transmitted.

3. A clocked driver circuit comprising:
a first gate circuit having one input terminal connected to a fist input terminal;
a second gate circuit having one input terminal connected to a second input terminal;
a first time constant circuit connected between an output terminal of said first gate circuit and another input terminal of said second gate circuit;
a second time constant circuit connected between an output terminal of said second gate circuit and another input terminal of said first gate circuit;
a first switching circuit for controlling a time constant of said first time constant circuit in accordance with an output from said first gate circuit; and
a second switching circuit for controlling a time constant of said second time constant circuit in accordance with an output from said second gate circuit, said first switching circuit being a first MOSFET whose source, gate, and drain are respectively connected to a first potential, the output terminal of said first gate circuit, and the other input terminal of said second gate circuit, and said second switching circuit being a second MOSFET whose source, gate, and drain are respectively connected o the first potential, the output terminal of said second gate circuit, and the other input terminal of said first gate circuit.

4. A clocked driver circuit comprising:
a first gate circuit having one input terminal connected to a first input terminal;
a second gate circuit having one input terminal connected to a second input terminal;
a first time constant circuit connected between an output terminal of said first gate circuit and another input terminal of said second gate circuit;
a second time constant circuit connected between an output terminal of said second gate circuit and another input terminal of said first gate circuit;
a first switching circuit for controlling a time constant of said first time constant circuit in accordance with an output from said first gate circuit; and 'a second switching circuit for controlling a time constant of said second tim constant circuit in accordance with an output from said second gate circuit, said first and second switching circuits controlling the time constants of said first and second time constant circuits so as to quickly change a potential of he other input terminal of each of said second and first gate circuits, said first and second MOSFETS being depletion N-channel MOSFETS.

5. A clocked driver circuit comprising:
a first gate circuit having oneinput terminal connected to a first input terminal;
a second gate circuit having one input terminal connected to a second input terminal;
a first item constant circuit connected between an output terminal of said first gate circuit and another input terminal of said second gate circuit;
a second time constant circuit connected between an output terminal of said second gate circuit and another input terminal of said first gate circuit;
each of said first and second time constant circuits being an RC time constant circuit constituted by a resistance and a capacitor,
a first switching circuit for controlling a time constant of said first item constant circuit in accordance with an output from said first ate circuit; and
a second switching circuit for controlling a time constant of said second time constant circuit in accordance with an output from said second gate circuit,
the resistance of said first time constant circuit being a first MOSFET whose source, gate, and drain are respectively connected to the output terminal of said first gate circuit, a second voltage, and the other input terminal of said second gate circuit, and the resistance of said second time constant circuit being a second MOSFET whose source, gate, and drain are respectively connected to the output terminal of said second gate circuit, the second voltage, and the other input terminal of said second gate circuit.

6. A clocked driver circuit comprising:
a first gate circuit having one input terminal connected to a first input terminal;
a second gate circuit having one input terminal connected to a second input terminal;
a first item constant circuit connected between an output terminal of said first gate circuit and another input terminal of said second gate circuit;
a second time constant circuit connected between an output terminal of said second gate circuit and another input terminal of said first gate circuit;
a first series-connected inverters connected between the other input terminal of said first gate circuit and said second time constant circuit, and a second series connected inverters connected between the other input terminal of said second gate circuit and said first time constant circuit,
a first switching circuit for controlling a time constant of said first time constant circuit in accordance with an output from said first gate circuit; and
a second switching circuit for controlling a time constant of said second time constant circuit in accordance with an output from said second gate circuit.

7. A clocked driver circuit comprising:
a first gate circuit having first and second input terminals and an output terminal respectively connected to a first input terminal, a first node, and a second node; a first inverter having input and output terminals respectively connected to the second node and a first output terminal;
a second gate circuit having first and second input terminals and an output terminal respectively connected to a third node, a second input terminal, and a fourth node;
a second inverter having input and output terminals respectively connected to the fourth node and a second output terminal;
a first MOSFET having a source, a gate, and an drain respectively connected to a first potential, the second output terminal, and the first node;
a second MOSFET having a source, a gate, and a drain respectively connected to the first potential, the first output terminal, and the third node;
a first resistive element connected between the second and third nodes;
a second resistive element connected between the first and fourth nodes;
a first capacitive element connected between the first node and the first potential; and
a second capacitive element connected between the third node and the first potential.

* * * * *